(12) United States Patent
Yamamoto

(10) Patent No.: US 6,297,694 B1
(45) Date of Patent: Oct. 2, 2001

(54) HIGH FREQUENCY POWER AMPLIFIER

(75) Inventor: Kazuya Yamamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/448,519

(22) Filed: Nov. 24, 1999

(30) Foreign Application Priority Data

May 20, 1999 (JP) .................................................. 11-140129

(51) Int. Cl.[7] ...................................................... H03F 1/14
(52) U.S. Cl. ............................ 330/51; 330/295; 330/298; 330/134
(58) Field of Search ........................... 330/51, 126, 295, 330/296, 298, 133, 134, 285

(56) References Cited

U.S. PATENT DOCUMENTS

| | | | |
|---|---|---|---|
| 5,182,527 | * 1/1993 | Nakanishi et al. | 330/285 |
| 6,114,911 | * 9/2000 | Iwai et al. | 330/295 |
| 6,118,343 | * 9/2000 | Winslow | 330/295 |
| 6,128,479 | * 10/2000 | Fitzpatrick et al. | 455/137 |
| 6,130,579 | * 10/2000 | Iyer et al. | 330/285 |

* cited by examiner

Primary Examiner—Robert Pascal
Assistant Examiner—Henry Choe
(74) Attorney, Agent, or Firm—Leydig, Voit & Mayer, Ltd

(57) ABSTRACT

A dual band system high frequency power amplifier has biasing circuits and a bias switching circuit, each circuit having heterojunction bipolar transistors (HBTs) so that the high frequency power amplifier can be integrated with an MMIC of HBTs. A bias switching circuit for switching a first biasing circuit and a second biasing circuit, each made with HBTs, is built with common AlGaAs or GaAs HBTs, having three or more such HBTs connected in series so that the total of each base-emitter voltage, Vbe, does not exceed 3 V.

18 Claims, 9 Drawing Sheets

HIGH FREQUENCY POWER AMPLIFIER

BACKGROUND OF THE INVENTION

1. Field of the Invention

The present invention relates to a high frequency power amplifier for dual band systems used, for example, in mobile telephones, and relates more particularly to a high frequency power amplifier of heterojunction bipolar transistors (HBT) having a bias switching circuit for switching a bias circuit to select a power amplifier.

2. Description of the Prior Art

Monolithic microwave integrated circuits (MMICs) and modules (hybrid ICs and multichip modules) using GaAs metal-semiconductor field effect transistors (MESFETs), GaAs high electron mobility transistors (HEMTs), or GaAs-based HBTs are widely used in power amplifiers for mobile communications devices. Compared with a conventional FET, a GaAs-based HBT does not require a negative gate bias voltage, enabling a single power supply operation, and can effect an on/off operation similarly to a Si-MOSFET but without an analog switch on the drain side. A further advantage is that GaAs-based HBTs can be used to achieve a smaller power amplifier generating a rated output power with a higher output power density than is possible with a conventional FET power amplifier. GaAs-based HBTs are therefore considered promising as power elements in future mobile communication devices.

With recent sharp increases in demand for mobile phones, telephones and services enabling access to two systems using a single handset have been introduced. In Europe, for example, there are two mobile telephone services: GSM 900 (Global System for Mobile Communications), a 900 MHz system that is the most widely used mobile telephone service in Europe, and DCS 1800, a competing system that operates in the 1800 MHz band. Japan also has two systems: Personal Digital Cellular (PDC), a 900 MHz mobile telephone system, and PHS (Personal Handyphone System), a 1900 MHz digital cordless telephone system. So-called dual band mobile phones that can switch between two different telephone services are already available.

FIG. 10 is an exemplary circuit block diagram of a high frequency power amplifier for use in a conventional dual band mobile phone.

Referring to FIG. 10, GSM 900 transistors TrA1 to TrA3, that is, HBTs for amplification in the 900 MHz band, are biased by a first biasing circuit 201. GSM 1800 TrB1 to TrB3, that is, HBTs for amplification in the 1800 MHz band, are biased by a second biasing circuit 202.

Bias switching circuit 203 exclusively selects and operates either the first biasing circuit 201 or second biasing circuit 202 based on the signal level of a two-valued input signal Vmod applied to the Vmod terminal. The bias switching circuit 203 also passes an output control signal based on the signal level of the input signal Vpc applied to the Vpc terminal to the first biasing circuit 201 or second biasing circuit 202 to adjust the level of the output signal passed from output terminals OUT1 and OUT2. When input signal Vpc is 0 V, the bias switching circuit 203 stops the operation of both the GSM 900 power amplifier and the GSM 1800 power amplifier regardless of input signal Vmod.

FIG. 11 is a typical circuit diagram of the bias switching circuit 203 used in the conventional high frequency power amplifier shown in FIG. 10. As shown in FIG. 11, this bias switching circuit 203 comprises a logic circuit 210 of CMOS or other silicon circuit elements, and an output buffer 211.

The output buffer 211 comprises a plurality of npn transistors TrC1 to TrC4 made in silicon. The logic circuit 210 converts the input signal Vpc supplied from a DA converter (not shown in the figure) according to the signal level of input signal Vmod, and outputs either signal V900 or V1800 through output buffer 211. The bias switching circuit 203 thus outputs signal V900 or V1800 to select a particular power amplifier and controls the signal level of the output signal from the selected power amplifier based on input signal Vpc, and stops operation of the other (unselected) power amplifier regardless of input signal Vpc.

It is to be noted that while the first biasing circuit 201 and second biasing circuit 202 shown in FIG. 10 are made with silicon elements, those shown in FIG. 12A and FIG. 12B are made using HBT as known from the literature. The biasing circuit shown in FIG. 12A can compensate for a change in the base-emitter voltage Vbe according to the temperature coefficient of the power amplification HBT in FIG. 10 by means of transistor TrD2, as can the biasing circuit shown in FIG. 12B using transistors TrD2 and TrD3.

It is to be noted that all transistors TrD1 to TrD3 in FIGS. 12A and 12B are HBTS, and either signal V900 or V1800 in FIG. 11 can be applied to either biasing circuit through the biasing circuit input terminal Vin.

Unlike an FET, however, an HBT operates by amplifying the base current, and requires a base current supply between several 10 to 100 mA to achieve the high 2 W to 4 W output of a GSM phone. It is, however, also difficult to directly obtain such a high base current from a standard Si-CMOS IC because the output current used to assure a specific output voltage from a standard CMOS device is a maximum of several milliamperes.

Furthermore, two power amplifiers can be easily controlled using input signals Vpc and Vmod due to the general utility of the logic circuit design when silicon elements are used in the bias switching circuit, but a separate control circuit using silicon elements is required for controlling devices other than the HBT power amplifier.

When silicon elements are used in the bias switching circuit and biasing circuits, or just the bias switching circuit, these circuits cannot be integrated to an MMIC comprising HBTs. A separate silicon chip is therefore needed, and this reduces yield during mass production.

SUMMARY OF THE INVENTION

With consideration for the aforementioned problems, an object of the present invention is to provide a dual band system high frequency power amplifier that can be integrated with an MMIC comprising HBTs by using HBTs to form the biasing circuits and bias switching circuit of each dual band system high frequency power amplifier comprising HBTs.

To achieve this object, a high frequency power amplifier according to the present invention has two power amplifiers each having at least one power amplifying heterojunction bipolar transistor (HBT), two biasing circuits each disposed for each power amplifier and including a HBT, and a bias switching circuit for exclusively switching operation between the biasing circuits in accordance with first and second signals input to the bias switching circuit. The bias switching circuit of the high frequency power amplifier has a first switching circuit including an HBT for controlling output of the first signal for controlling biasing circuit operation to one of the biasing circuits; a second switching circuit including an HBT for controlling output of the first signal to an other biasing circuit; and a third switching circuit including an HBT for controlling operation of the second switching circuit according to the second signal for controlling operation of the first switching circuit to exclusively select and operate the first and second switching circuits.

The bias switching circuit for switching operation of biasing circuits constructed with HBTs thus has a first switching means for controlling output to one biasing circuit, a second switching circuit for controlling output to another biasing circuit, and a third switching circuit for exclusively selecting the first or second switching circuit to operate. The first to third switching means of the bias switching circuit are made using common AlGaAs or GaAs HBTs, three or more of which are connected in series so that the total combined base-emitter voltage Vbe does not exceed 3 V. The bias switching circuit can therefore operate reliably even in low 3-V power supply systems, and can thus be integrated with an HBT MMIC to simply the manufacturing process.

The first and second switching means each preferably has a resistance series circuit having a plurality of resistors connected in series for voltage dividing the signal Vpc voltage, wherein the HBT in each of the first and second switching means is a ground connecting HBT for controlling connection of the resistance series circuit to ground, and output a control signal to a corresponding biasing circuit from a node between specific resistors in this resistance series circuit.

The bias switching circuit can thus be achieved using few HBT and resistors, and the increase in MMIC chip size resulting from bias switching circuit integration can be minimized.

Yet further preferably, each power amplifier is a multistage power amplifier for power amplifying by means of a plurality of power amplifying HBTs, each corresponding biasing circuit has a circuit for supplying bias to each power amplifying HBT, and the first and second switching circuits output control signals to the corresponding biasing circuit so that the first signal current gradually increases from a bias supplied to the first stage power amplifying HBT to a bias supplied to the last stage power amplifying HBT.

It is therefore possible to minimize the voltage drop in signal Vpc to the circuit supplying bias to the last-stage power amplifying HBT in each biasing circuit, that is, the HBT from which the most current flows for a signal Vpc.

Yet further preferably, the first and second switching circuit each further has a signal level adjusting resistor for adjusting the level of the control signal applied to the corresponding biasing circuit, the signal level adjusting resistor being parallel connected to a node between specific resistors in the resistance series circuit and a node between the resistance series circuit and ground connecting HBT.

Yet further preferably, an HBT in the third switching circuit controls bias supply to the base of the HBT in the second switching circuit according to the second signal. A bias switching circuit of HBTs that can operate in a 3-V system can thus be achieved, and the bias switching circuit can be integrated with a HBT MMIC.

When it is additionally desirable to prevent thermal runaway and heat damage to the power amplifier resulting from an externally applied overvoltage, the first and second switching circuits each further preferably includes a protection circuit for protecting each biasing circuit from an overvoltage applied to a terminal which receives the first signal. In this case, each protection circuit is preferably a Vbe multiplier comprising an HBT. As a result, thermal runaway and heat damage to the power amplifier resulting from an externally applied overvoltage can be prevented with a simple circuit design.

BRIEF DESCRIPTION OF THE DRAWINGS

The present invention will be readily understood from the following description of preferred embodiments thereof made with reference to the accompanying drawings, in which like parts are designated by like reference numeral and in which.

DESCRIPTION OF THE PREFERRED EMBODIMENTS

The preferred embodiments of the present invention are described below with reference to the accompanying figures.

Embodiment 1

Figure 1:
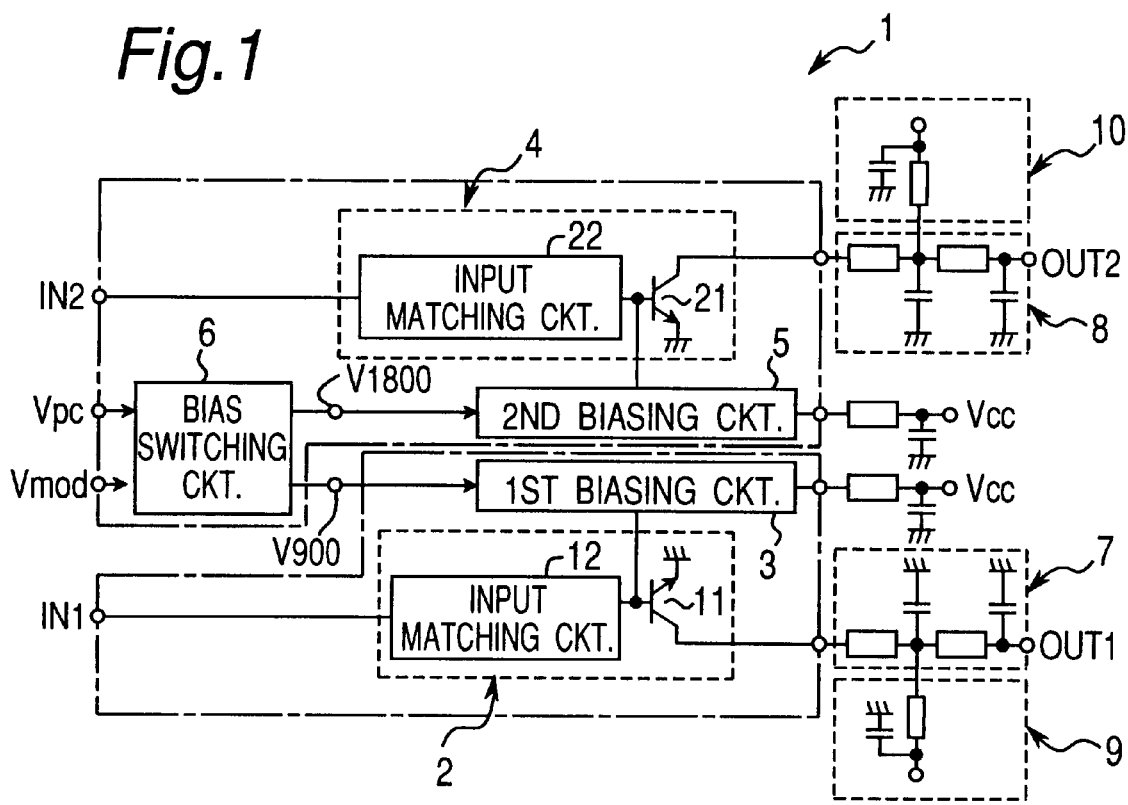
FIG. 1 is a typical circuit diagram of a high frequency power amplifier for a dual band system according to a first embodiment of the present invention.

FIG. 1 is a typical circuit diagram of a high frequency power amplifier for a dual band system according to a first embodiment of the present invention. It is to be noted that the dual band system high frequency power amplifier shown in FIG. 1 comprises two single-stage power amplifiers, one each for GMS 900 and GMS 1800 systems.

As shown in FIG. 1, high frequency power amplifier 1 comprises a first power amplifier 2, a GSM 900 power amplifier; a first biasing circuit 3 for biasing the first power amplifier 2; a second power amplifier 4, a GSM 1800 power amplifier; a second biasing circuit 5 for biasing the second power amplifier 4; a bias switching circuit 6 for exclusively selecting and operating either first biasing circuit 3 or second biasing circuit 5; output matching circuits 7 and 8; and collector biasing circuits 9 and 10.

The first power amplifier 2 comprises power amplifying HBT 11 and input matching circuit 12. HBT 11 power amplifies a high frequency signal input from input terminal IN1 through input matching circuit 12, and outputs the amplified high frequency signal from output terminal OUT1 through output matching circuit 7. Bias is supplied from collector biasing circuit 9 to the collector of HBT 11, and another bias is supplied from the first biasing circuit 3 to the base of HBT 11, for this operation.

The second power amplifier 4 similarly comprises power amplifying HBT 21 and input matching circuit 22. The HBT 21 power amplifies a high frequency signal input from input terminal IN2 through input matching circuit 22, and outputs the amplified high frequency signal from output terminal OUT2 through output matching circuit 8. Bias is supplied from collector biasing circuit 10 to the collector of HBT 21, and another bias is supplied from the second biasing circuit 5 to the base of HBT 21, for this operation.

Operation of the first biasing circuit 3 and second biasing circuit 5 is controlled by bias switching circuit 6. More specifically, the bias switching circuit 6 outputs a signal V900, which is a control signal for the first biasing circuit 3, or a signal V1800, which is a control signal for the second biasing circuit 5, to exclusively select and operate first biasing circuit 3 or second biasing circuit 5 based on the signal level of a two-value input signal Vmod (which is high at 3 V or low at 0 V, for example) applied from an external source to the Vmod terminal.

Based on the signal level of an input signal Vpc applied to the Vpc terminal from an external source, the bias switching circuit 6 also outputs signal V900 or signal V1800 to adjust the output level of the signal passed from output terminals OUT1 and OUT2. By varying the level of input signal Vpc between 0 to 3 V, for example, the signal level of the output signal from output terminal OUT1 or OUT2 can be varied from a minus several ten dBm to +34 dBm. In addition, when input signal Vpc is 0 V, bias switching circuit 6 stops bias supply to both first biasing circuit 3 and second biasing circuit 5 to stop operation of both first power amplifier 2 and second power amplifier 4.

Figure 2:
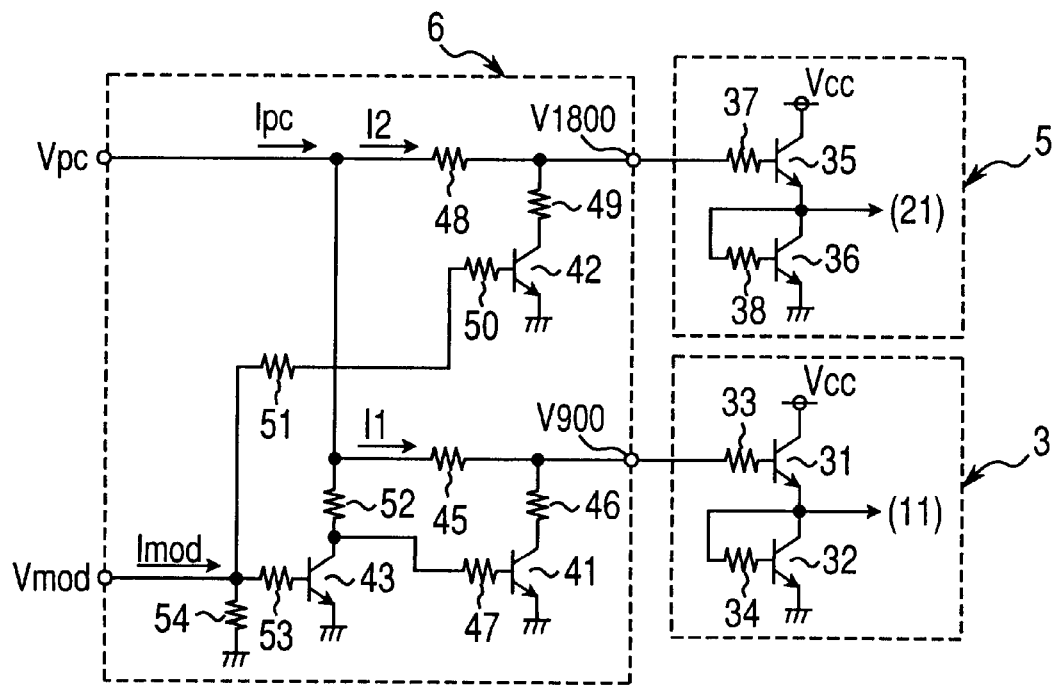
FIG. 2 shows the first biasing circuit, second biasing circuit, and bias switching circuit shown in FIG. 1.

FIG. 2 is a detailed circuit diagram of first biasing circuit 3, second biasing circuit 5, and bias switching circuit 6 shown in FIG. 1. As shown in FIG. 2, the first biasing circuit 3 comprises HBT 31 and 32, and resistors 33 and 34. Resistor 33 is the base resistance of HBT 31, and resistor 34 is the base resistance of HBT 32.

The collector of HBT 31 is connected to power supply terminal Vcc to which a specific dc supply voltage is applied; the emitter is connected to the collector of HBT 32; and the node between the HBT 31 emitter and HBT 32 collector is connected to the base of HBT 11 in the first power amplifier 2 and is thus used as the output of the first biasing circuit 3. The base of HBT 31 is connected through resistor 33 to the V900 output terminal of bias switching circuit 6. Control signal V900 is thus applied from bias switching circuit 6 to the base of HBT 31.

The base of HBT 32 is connected through resistor 34 to the collector, and the emitter is to ground. HBT 32 can thus compensate for a change in the base-emitter voltage Vbe according to the temperature coefficient of HBT 11 in first power amplifier 2.

The second biasing circuit 5 similarly comprises HBTs 35 and 36, and resistors 37 and 38. Resistor 37 is the base resistance of HBT 35, and resistor 38 is the base resistance of HBT 36. The collector of HBT 35 is connected to power supply terminal Vcc, the emitter to the collector of HBT 36, and this emitter-collector node is connected to the base of HBT 21 in the second power amplifier 4 and is thus used as the output of the second biasing circuit 5. The base of HBT 35 is connected through resistor 37 to the V1800 output terminal of bias switching circuit 6. Control signal V1800 is thus applied from bias switching circuit 6 to the base of HBT 35.

The base of HBT 36 is connected through resistor 38 to the collector, and the emitter is to ground. HBT 36 can thus compensate for a change in the base-emitter voltage Vbe according to the temperature coefficient of HBT 21 in second power amplifier 4.

The bias switching circuit 6 comprises HBTs 41 to 43, and resistors 45 to 54. Terminal Vpc is connected through a series circuit of resistors 45 and 46 to the collector of HBT 41. The node between resistors 45 and 46 is connected to terminal V900 of bias switching circuit 6, and through resistor 33 of first biasing circuit 3 to the base of HBT 31. The base of HBT 41 is connected through resistor 47 to the collector of HBT 43, and the emitter is to ground.

Terminal Vpc is likewise connected through a series circuit of resistors 48 and 49 to the collector of HBT 42. The node between resistors 48 and 49 is connected to terminal V1800 of bias switching circuit 6, and through resistor 37 of second biasing circuit 5 to the base of HBT 35. The base of HBT 42 is connected through a series circuit of resistors 50 and 51 to terminal Vmod, and the emitter is to ground. Terminal Vmod is connected to the base of HBT 43 through resistor 53, and to ground through resistor 54. The collector of HBT 43 is connected to terminal Vpc through resistor 52, and the emitter is to ground.

When 2.7 V is applied to terminal Vpc in a bias switching circuit 6 thus comprised, 3 V is applied to terminal Vmod and Vmod thus goes high, HBT 43 switches on. HBT 41 therefore switches off and HBT 42 switches on. When HBT 42 is on, voltage Vpc of terminal Vpc is voltage divided by resistors 48 and 49. If the resistance of resistor 48 is R48 and the resistance of resistor 49 is R49, the voltage at terminal V1800 drops to $\{Vpc \times R49/(R48+R49)\}$. As a result, HBTs 35 and 36 in the second biasing circuit 5 turn off.

Current also flows through resistor 45 and resistor 33 to the base of HBT 31 in first biasing circuit 3 because HBT 41 is off. As a result, bias dependent on voltage Vpc is supplied from the output of first biasing circuit 3 to the base of HBT 11 in first power amplifier 2, and output power dependent on the voltage Vpc can be obtained from the output terminal OUT1 of first power amplifier 2.

If, for example, 2.7 V is then applied to terminal Vpc, and 0 V is applied to terminal Vmod so that terminal Vmod goes low, HBT 43 switches off; HBT 41 therefore switches on, and HBT 42 switches off. When HBT 41 is on, voltage Vpc at terminal Vpc is voltage divided by resistors 45 and 46. If the resistance of resistor 45 is R45 and the resistance of resistor 46 is R46, the voltage at terminal V900 drops to $\{Vpc \times R46/(R45+R46)\}$. As a result, HBTs 31 and 32 in the first biasing circuit 3 turn off.

Current also flows through resistor 48 and resistor 37 to the base of HBT 35 in second biasing circuit because HBT 41 is on. As a result, bias dependent on voltage Vpc is supplied from the output of second biasing circuit 5 to the base of HBT 21 in second power amplifier 4, and output power dependent on the voltage Vpc can be obtained from the output terminal OUT2 of second power amplifier 4.

When voltage Vpc goes to 0 V, HBT 31 in first biasing circuit 3 and HBT 35 in second biasing circuit 5 turn off irrespective of the voltage at terminal Vmod, that is, regardless of the operating state of HBT 41 and HBT 42. As a result, both first power amplifier 2 and second power amplifier 4 stop operating.

By thus using a bias switching circuit 6 of HBTs, a dual band system high frequency power amplifier 1 can be achieved using two chips, a GSM 900 chip comprising first power amplifier 2 and first biasing circuit 3, and a GSM 1800 chip comprising second power amplifier 4 and second biasing circuit 5, and the bias switching circuit 6 can be formed on either of these two chips.

The circuit current required for switching the bias switching circuit 6 is supplied from terminal Vpc, and the current supplied from terminal Vpc increases compared with a conventional bias switching circuit comprising silicon elements. The increase can be controlled by optimizing the values (Ra+Rb) and Ra where R45=R48=Ra, and R46=R49=Rb. For example, when first biasing circuit 3 is operating and second biasing circuit 5 is stopped, the voltage drop at resistor 45 will be (I1×Ra) where I1 is the current flowing to resistor 45, and the voltage drop at resistor 48 will be {Vpc×Ra/(Ra+Rb)}. It is therefore possible by optimizing the values of Ra and Rb to minimize the current supplied from terminal Vpc within the range where no problems will occur for practical purposes.

Figure 3A:
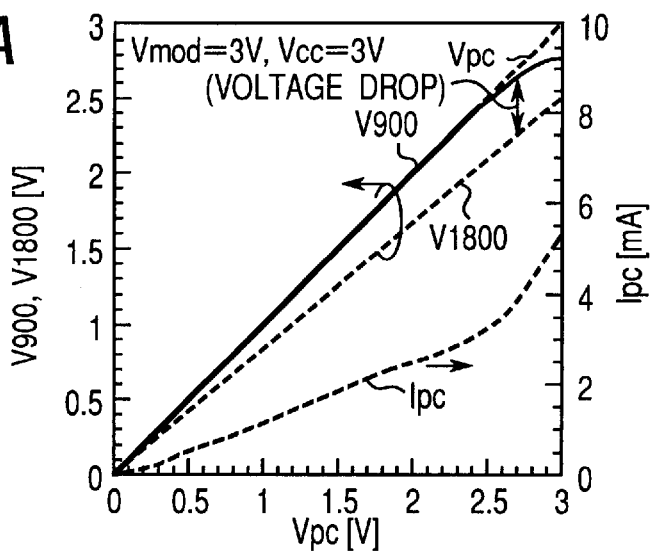
FIG. 3A, FIG. 3B and FIG. 3C are graphs showing an operating characteristic of the bias switching circuit shown in FIG. 2.
Figure 3B:
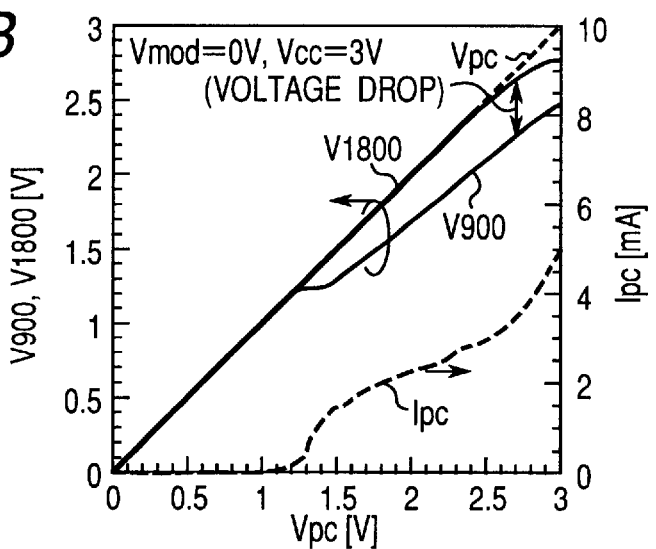
Figure 3C:
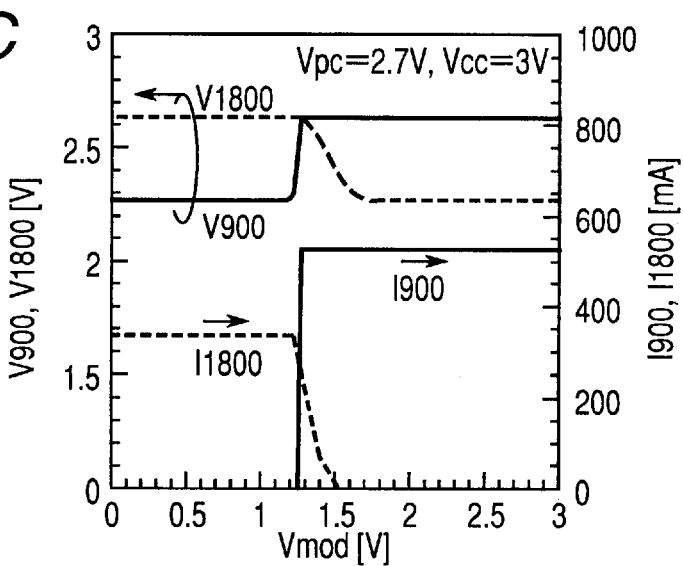

FIG. 3A to FIG. 3C are graphs showing an operating characteristic of the bias switching circuit shown in FIG. 2 under various conditions. FIG. 3A shows the relationship between current Ipc supplied from terminal Vpc, and voltages V900 and V1800 at terminal V900 and terminal V1800 in response to a voltage Vpc, when Vmod is 3 V. FIG. 3B shows the same when Vmod is 0 V. FIG. 3C shows the relationship between current I900 output from terminal V900, current I1800 output from terminal V1800, and voltages V900 and V1800 at terminal V900 and terminal V1800 in response to a voltage Vmod, when Vpc is 2.7 V It will be known from FIGS. 3A to 3C that when Vpc is 2.7 V, the current supply can be switched between first power amplifier 2 and second power amplifier 4 with a current Ipc of approximately 3.5 mA.

Figure 4:
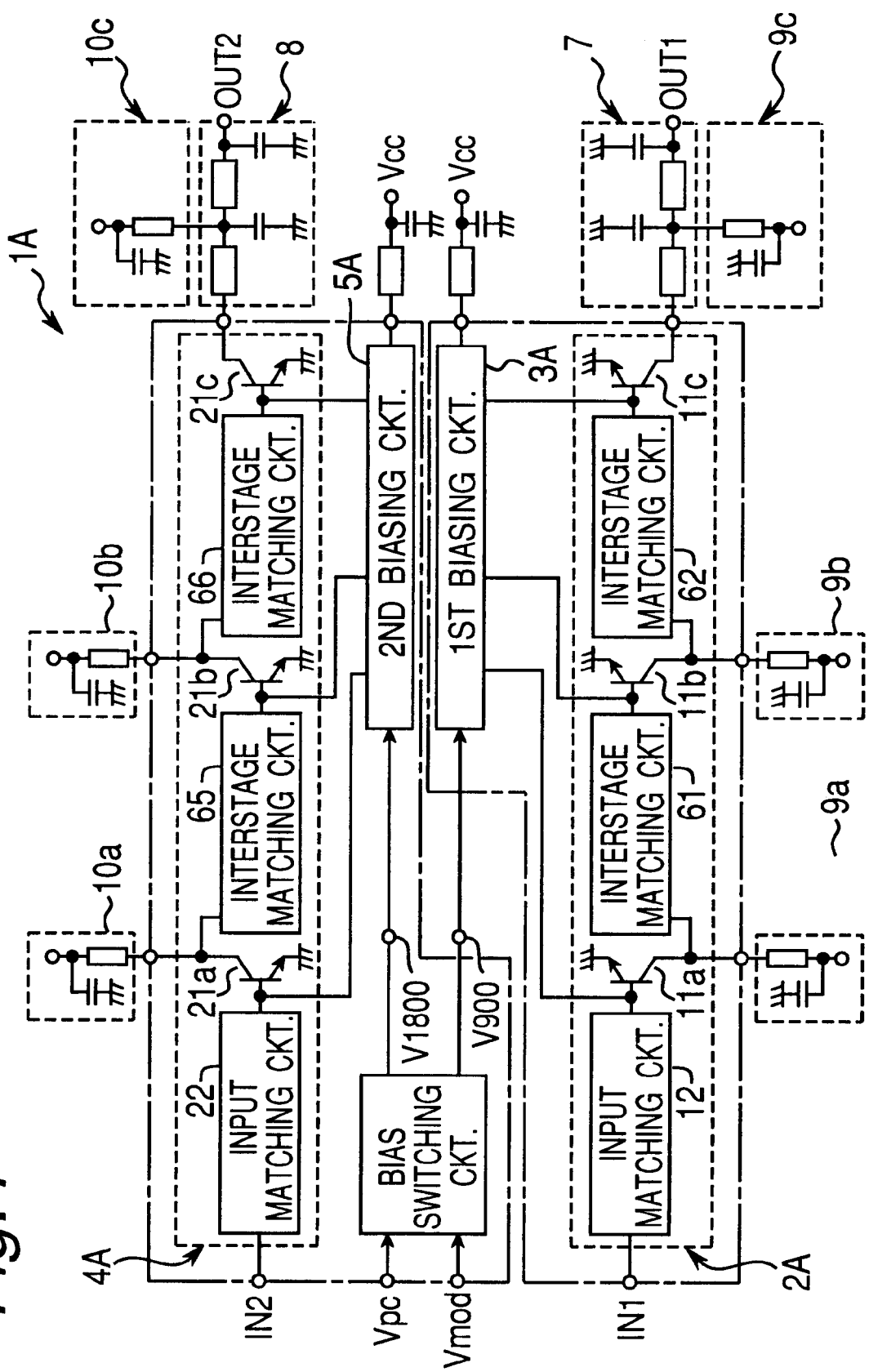
FIG. 4 is a typical circuit diagram showing an alternative version of the high frequency power amplifier for a dual band system shown in FIG. 1.

It is to be noted that while the present invention has been described above with reference to a single-stage power amplifier in FIG. 1 and FIG. 2, the present invention shall not be so limited and can obviously be applied to a multi-stage power amplifier. FIG. 4 is a typical circuit diagram showing an alternative version of the high frequency power amplifier for a dual band system shown in FIG. 1. It is to be noted that a high frequency power amplifier for a dual band system having a three-stage power amplifier is shown in FIG. 4, and that like parts are indicated by the same reference numerals. Further description of such like parts is omitted below where only the differences between the high frequency power amplifier shown in FIG. 1 and that in FIG. 4 are described.

The high frequency power amplifier shown in FIG. 4 differs from that in FIG. 1 in that the first power amplifier 2 and second power amplifier 4 are each a three-stage power amplifier. The circuit design of the first biasing circuit 3 and second biasing circuit 5 in FIG. 1 is thus also changed. The first power amplifier 2 in FIG. 1 is thus shown in FIG. 4 and referred to below as first power amplifier 2A, the first biasing circuit 3 as first biasing circuit 3A, the second power amplifier 4 as second power amplifier 4A, the second biasing circuit 5 as second biasing circuit 5A, and the high frequency power amplifier 1 as high frequency power amplifier 1A.

As shown in FIG. 4, first power amplifier 2A comprises HBTs 11a to 11c for power amplifying; input matching circuit 12; and interstage matching circuits 61 and 62.

HBT 11a power amplifies a high frequency signal input from input terminal IN1 through input matching circuit 12, and HBT 11b power amplifies the high frequency signal amplified by HBT 11a and input thereto through interstage matching circuit 61. HBT 11c power amplifies the high frequency signal amplified by HBT 11b and input thereto through interstage matching circuit 62. The amplified high frequency signal is then output through output matching circuit 7 from output terminal OUT1.

Bias is supplied to the collector of HBTs 11a to 11c from corresponding collector biasing circuits 9a to 9c. Bias is also supplied to the base of HBTs 11a to 11c from first biasing circuit 3A.

Second power amplifier 4A likewise comprises HBTs 21a to 21c for power amplifying; input matching circuit 22; and interstage matching circuits 65 and 66.

HBT 21a power amplifies a high frequency signal input from input terminal IN1 through input matching circuit 22, and HBT 21b power amplifies the high frequency signal amplified by HBT 21a and input thereto through interstage matching circuit 65. HBT 21c power amplifies the high frequency signal amplified by HBT 21b and input thereto through interstage matching circuit 66. The amplified high frequency signal is then output through output matching circuit 8 from output terminal OUT2.

Bias is supplied to the collector of HBTs 21a to 21c from corresponding collector biasing circuits 10a to 10c. Bias is also supplied to the base of HBTs 21a to 21c from second biasing circuit 5A.

As with the high frequency power amplifier 1 shown in FIG. 1 and FIG. 2, bias switching circuit 6 controls operation of the first biasing circuit 3A and second biasing circuit 5A. More specifically, bias switching circuit 6 outputs a signal V900, which is a control signal for the first biasing circuit 3A, or a signal V1800, which is a control signal for the second biasing circuit 5A, to exclusively select and operate first biasing circuit 3A or second biasing circuit 5A based on the signal level of a two-value input signal Vmod. Based on the signal level of an input signal Vpc applied to the Vpc terminal from an external source, bias switching circuit 6 also outputs signal V900 or signal V1800 to adjust the output level of the signal passed from output terminals OUT1 and OUT2.

Figure 5:
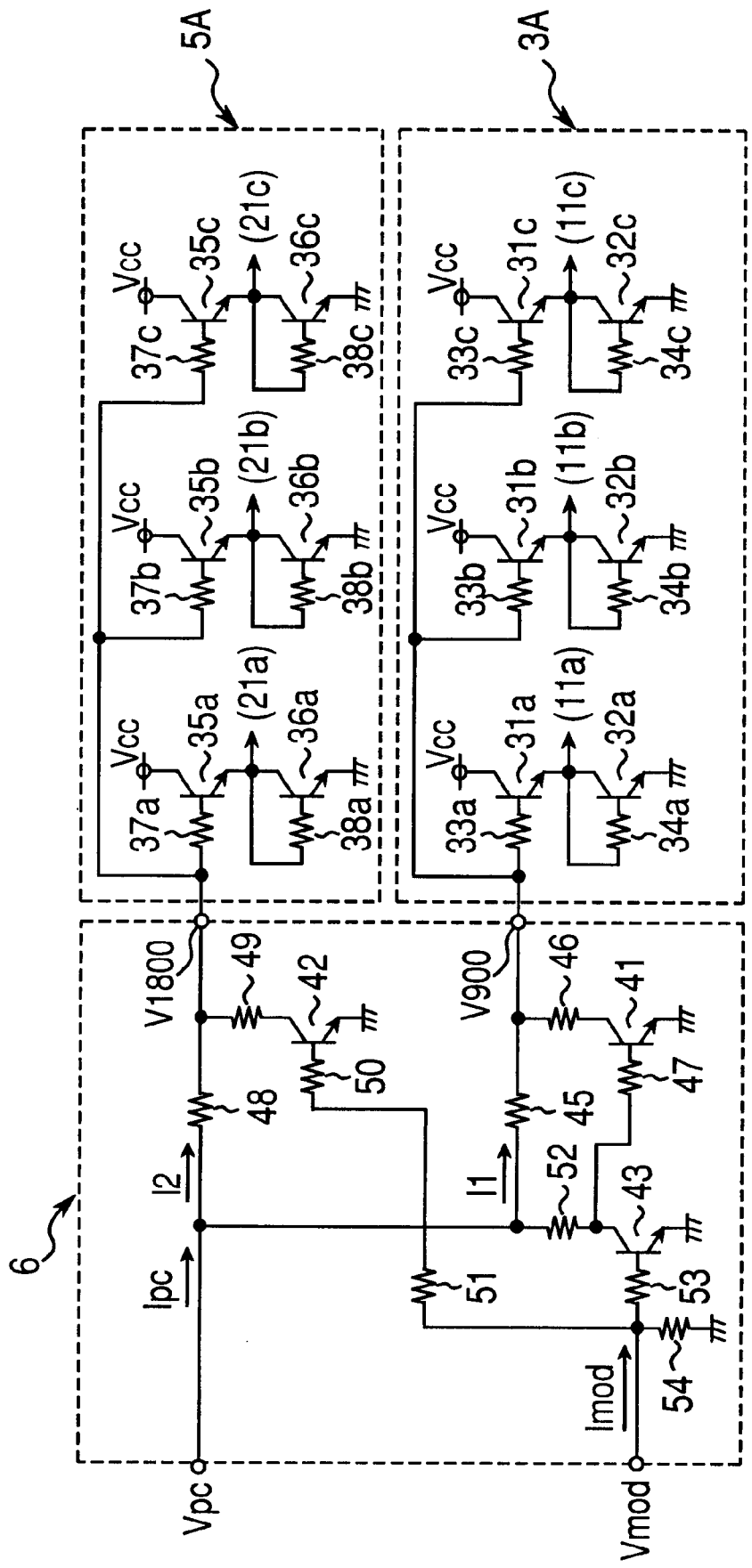
FIG. 5 shows the first biasing circuit, second biasing circuit, and bias switching circuit shown in FIG. 4.

FIG. 5 is a typical circuit diagram of first biasing circuit 3A, second biasing circuit 5A, and bias switching circuit 6 shown in FIG. 4. It is to be noted that like parts in FIG. 5 and FIG. 2 are indicated by the same reference numerals. Further description of such like parts is omitted below where only the differences between FIG. 5 and FIG. 2 are described.

FIG. 5 differs from FIG. 2 in that a biasing circuit identical to the first biasing circuit 3 shown in FIG. 2 is disposed for each of the HBTs 11a to 11c in the first power amplifier 2A, and a biasing circuit identical to second biasing circuit 5 in FIG. 2 is disposed for each of the HBTs 21a to 21c in the second power amplifier 4A.

As shown in FIG. 5, first biasing circuit 3A comprises HBTs 31a to 31c and 32a to 32c, and resistors 33a to 33c and 34a to 34c. Resistors 33a to 33c are the base resistance of the corresponding HBT 31a to 31c, and resistors 34a to 34c are the base resistance of the corresponding HBT 32a to 32c. It is to be noted that HBTs 31a to 31c correspond to HBT 31 in FIG. 2, HBTs 32a to 32c to HBT 32 in FIG. 2, resistors 33a to 33c to resistor 33 in FIG. 2, and resistors 34a to 34c to resistor 34 in FIG. 2. Connections thereto are also the same as shown in the first biasing circuit 3 in FIG. 2, and further description thereof is thus omitted below.

The node between the emitter of HBT 31a and the collector of HBT 32a is connected to the base of HBT 11a in first power amplifier 2A. The node between the emitter of HBT 31b and the collector of HBT 32b is connected to the base of HBT 11b in first power amplifier 2A. The node between the emitter of HBT 31c and the collector of HBT 32c is likewise connected to the base of HBT 11c in the first power amplifier 2A.

The second biasing circuit 5A likewise comprises HBTs 35a to 35c and 36a to 36c, and resistors 37a to 37c and 38a to 38c. Resistors 37a to 37c are the base resistance of the corresponding HBT 35a to 35c, and resistors 38a to 38c are the base resistance of the corresponding HBT 36a to 36c. It is to be noted that HBTs 35a to 35c correspond to HBT 35 in FIG. 2, HBTs 36a to 36c to HBT 36 in FIG. 2, resistors 37a to 37c to resistor 37 in FIG. 2, and resistors 38a to 38c to resistor 38 in FIG. 2. Connections thereto are also the same as shown in the second biasing circuit 5 in FIG. 2, and further description thereof is thus omitted below.

The node between the emitter of HBT 35a and the collector of HBT 36a is connected to the base of HBT 21a in second power amplifier 4A. The node between the emitter of HBT 35b and the collector of HBT 36b is connected to the base of HBT 21b in second power amplifier 4A. The node between the emitter of HBT 35c and the collector of HBT 36c is likewise connected to the base of HBT 21c in the second power amplifier 4A.

The bases of HBT 31a to 31c are connected through corresponding resistors 33a to 33c to the V900 terminal of bias switching circuit 6. The bases of HBT 35a to 35c are connected through corresponding resistors 37a to 37c to the V1800 terminal of bias switching circuit 6.

Operation of this first biasing circuit 3A is identical to the operation of the first biasing circuit 3 shown in FIG. 2, operation of second biasing circuit 5A is identical to second biasing circuit 5 in FIG. 2, and operation of the bias switching circuit 6 with respect to first biasing circuit 3A and second biasing circuit 5A is also the same as described above with reference to FIG. 2. Further description thereof is thus omitted below.

By thus using a bias switching circuit 6 of HBTs, a dual band system high frequency power amplifier 1A can be achieved using two chips, a GSM 900 chip comprising first power amplifier 2A and first biasing circuit 3A, and a GSM 1800 chip comprising second power amplifier 4A and second biasing circuit 5A, and the bias switching circuit 6 can be formed on either of these two chips.

Figure 6:
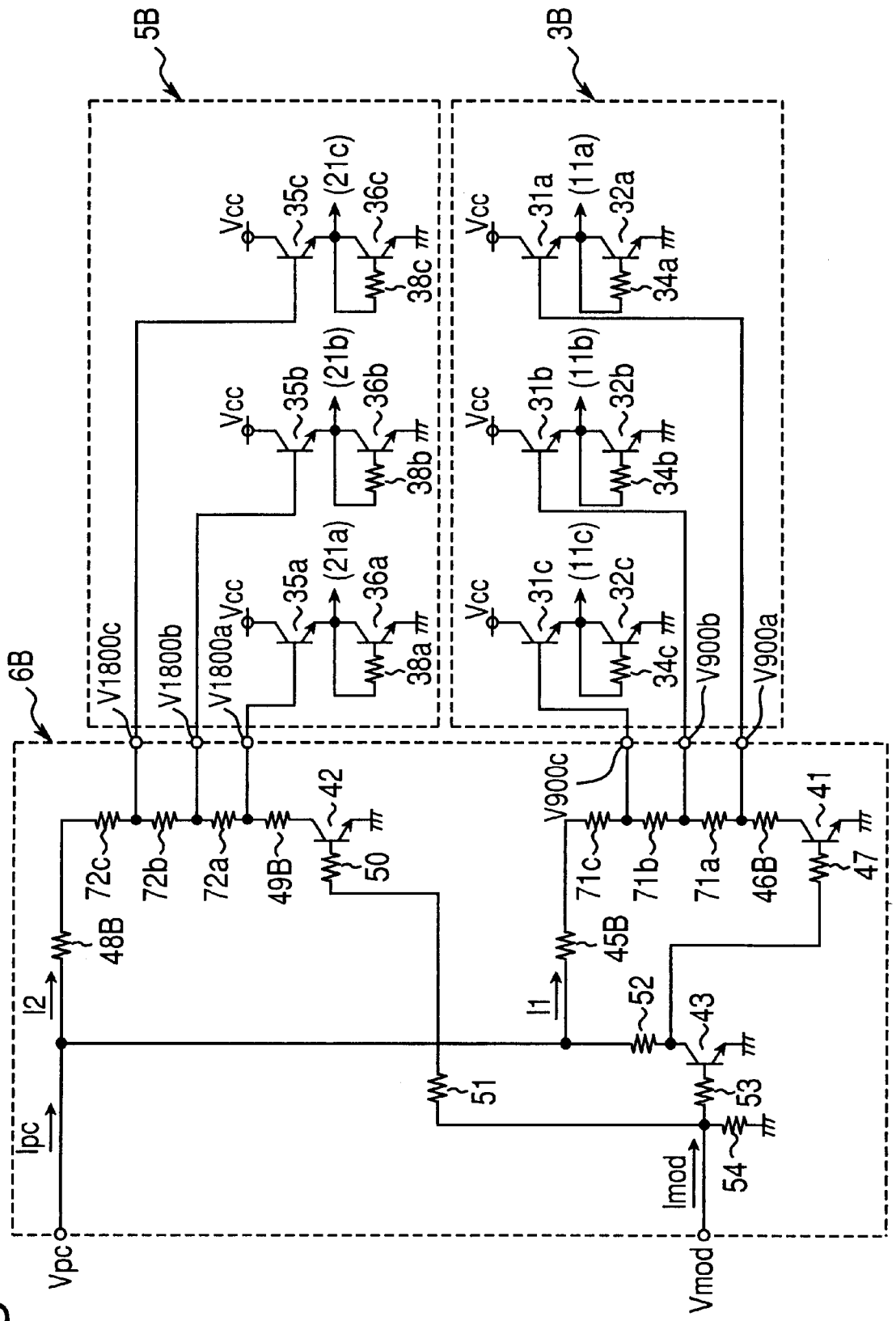
FIG. 6 is a typical circuit diagram showing an alternative version of the first biasing circuit, second biasing circuit, and bias switching circuit.

FIG. 6 is a circuit diagram of a further alternative embodiment of the first biasing circuit 3A, second biasing circuit 5A, and bias switching circuit 6 shown in FIG. 4. It is to be noted that like parts in FIG. and FIG. 6 are indicated by the same reference numerals. Further description of such like parts is omitted below where only the differences between FIG. 5 and FIG. 6 are described.

The circuits shown in FIG. 6 differ from those in FIG. 5 in that base resistors 33a to 33c of the first biasing circuit 3A in FIG. 5, and base resistors 37a to 37c in the second biasing circuit 5A in FIG. 5, are omitted; and a series circuit of resistors 71a to 71c is inserted between resistors 45 and 46, and a series circuit of resistors 72a to 72c is inserted between resistors 48 and 49, in the bias switching circuit 6 in FIG. 5. Resistors 45, 46, 48, and 49 in FIG. 5 are therefore shown in FIG. 6 and referred to below as resistors 45B, 46B, 48B, and 49B; first biasing circuit 3A as first biasing circuit 3B; second biasing circuit 5A as second biasing circuit 5B; and bias switching circuit 6 as bias switching circuit 6B.

As noted above and shown in FIG. 6, a series circuit of resistors 71a to 71c is inserted between resistors 45B and 46B of the bias switching circuit 6B, and the node between resistor 46B and resistor 71a is connected to the base of HBT 31a through intervening output terminal V900a of bias switching circuit 6B. The node between resistor 71a and resistor 71b is connected to the base of HBT 31b through output terminal V900b of bias switching circuit 6B. The node between resistor 71b and resistor 71c is connected to the base of HBT 31c through output terminal V900c of bias switching circuit 6B.

A series circuit of resistors 72a to 72c is likewise inserted between resistors 48B and 49B of bias switching circuit 6B. The node between 49B and resistor 72a is connected to the base of HBT 35a through output terminal V1800a of bias switching circuit 6B; the node between resistor 72a and resistor 72b is connected to the base of HBT 35b through output terminal V1800b; and the node between resistor 72b and resistor 72c is connected to the base of HBT 35c through output terminal V1800c.

Voltage drop in the base bias voltage from terminal Vpc due to HBT 31c through which the highest base current flows when first biasing circuit 3B operates, or HBT 35c through which the highest base current flows when second biasing circuit 5B operates can therefore be minimized. This is effective when all of the circuits of the dual band system high frequency power amplifier are integrated into a single chip.

Figure 7:
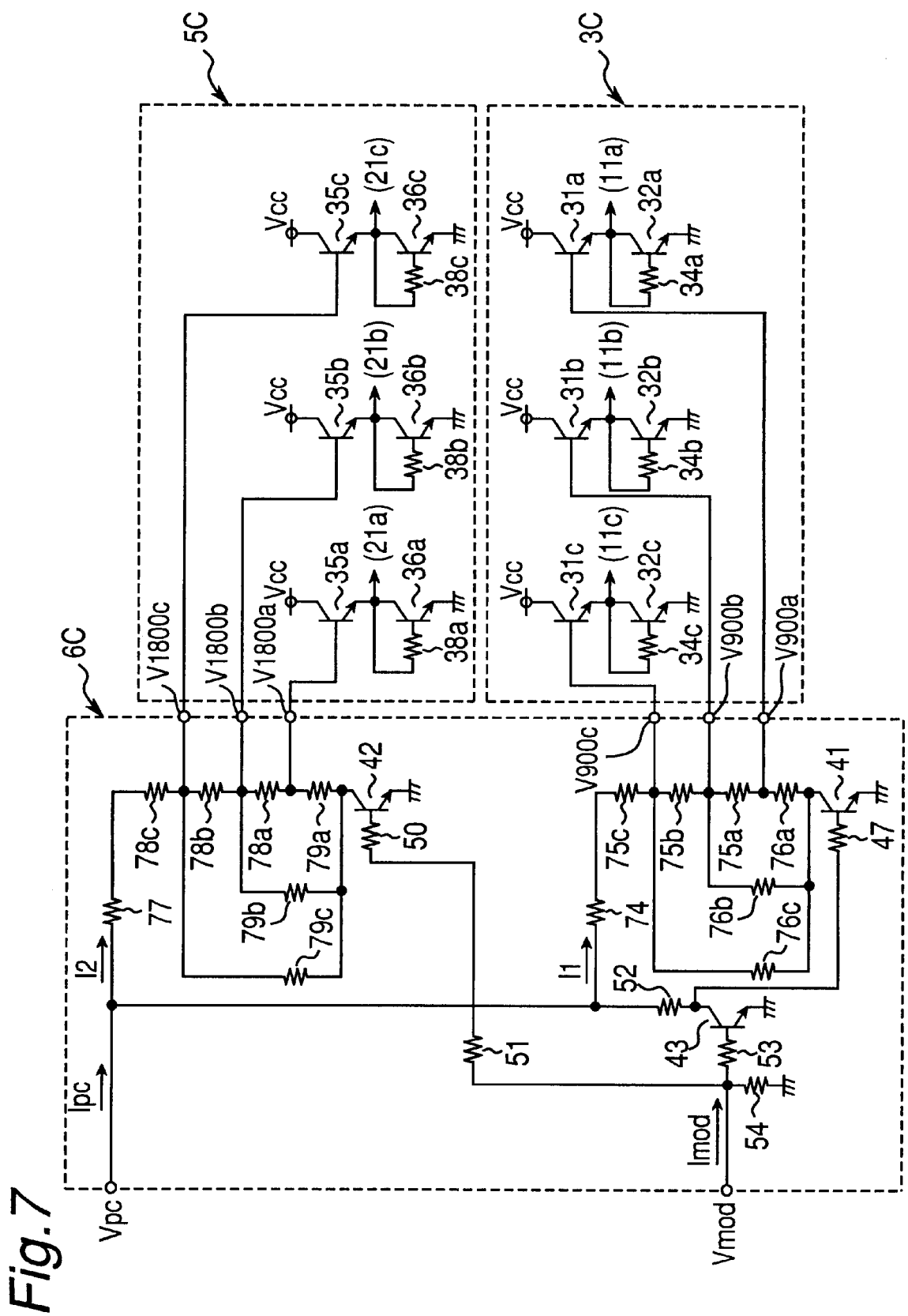
FIG. 7 is a typical circuit diagram showing a further alternative version of the first biasing circuit, second biasing circuit, and bias switching circuit.

FIG. 7 is a circuit diagram of a further alternative embodiment of the first biasing circuit 3A, second biasing circuit 5A, and bias switching circuit 6 shown in FIG. 4. It is to be noted that like parts in FIG. 5, FIG. 6 and FIG. 7 are indicated by the same reference numerals. Further description of such like parts is omitted below where only the differences between FIG. 7 and FIG. 6 are described.

The bias switching circuit 6C shown in FIG. 7 differs from the bias switching circuit 6B in FIG. 6 in that resistors 74, 75a to 75c, and 76a to 76c are provided in place of resistors 45B, 46B, and 71a to 71c; and resistors 77, 78a to 78c, and 79a to 79c are provided in place of resistors 48B, 49B, and 72a to 72c.

As shown in FIG. 7, a series circuit of resistors 74, 75a to 75c, and 76a is connected between terminal Vpc of bias switching circuit 6C and the collector of HBT 41. The node between resistors 75a and 76a is connected to the base of HBT 31a through output terminal V900a of bias switching circuit 6C; the node between resistors 75a and 75b is connected to the base of HBT 31b through output terminal V900b of bias switching circuit 6C; and the node between resistors 75b and 75c is connected to the base of HBT 31c through output terminal V900c. Note, further, that resistor 76b is connected between terminal V900b and the collector of HBT 41, and resistor 76c is connected between terminal V900c and the collector of HBT 41.

A series circuit of resistors 77, 78a to 78c, and 79a is similarly connected between terminal Vpc of bias switching circuit 6C and the collector of HBT 42. The node between resistors 78a and 79a is connected to the base of HBT 35a through output terminal V1800a of bias switching circuit 6C; the node between resistors 78a and 78b is connected to the base of HBT 35b through output terminal V1800b of bias switching circuit 6C; and the node between resistors 78b and 78c is connected to the base of HBT 35c through output terminal V1800c. Note, further, that resistor 79b is connected between terminal V1800b and the collector of HBT 42, and resistor 79c is connected between terminal V1800c and the collector of HBT 42.

Voltage drop in the base bias voltage from terminal Vpc due to HBT 31c through which the highest base current flows when first biasing circuit 3C operates, or HBT 35c through which the highest base current flows when second biasing circuit 5C operates can therefore be minimized. This is effective when all of the circuits of the dual band system high frequency power amplifier are integrated into a single chip. It is also possible to optimize the current supplied to the base of HBTs 31a to 31c and 35a to 35c by controlling the resistance ratio of the resistors, and it is thereby possible to optimize current Ipc.

The bias switching circuit for switching operation between a first biasing circuit and a second biasing circuit, each made with HBTs, is thus made with readily available AlGaAs or GaAs HBTs in a high frequency power amplifier according to this first preferred embodiment of the present invention, and three or more HBTs are connected in series to assure that the total of each base-emitter voltage Vbe does not exceed 3 V. It is therefore possible to construct a dual band system high frequency power amplifier using HBTs of which the on voltage of the base-emitter voltage Vbe is high (1.35 V, for example). As a result, this high frequency power amplifier can be integrated into an MMIC that can operate reliably even at a 3-V low supply voltage, and the manufacturing process can therefore be simplified.

Embodiment 2

If an overvoltage is applied to input terminal Vpc of the bias switching circuits in the various versions of the first embodiment described above, this overvoltage is also applied to the first and second biasing circuit. It is alternatively possible, however, to dispose an overvoltage protection circuit to the bias switching circuit so that an overvoltage applied to the input terminal Vpc is not applied to the first and second biasing circuits. A dual band system high frequency power amplifier so comprised is described below as the second preferred embodiment of the present invention.

Figure 8:
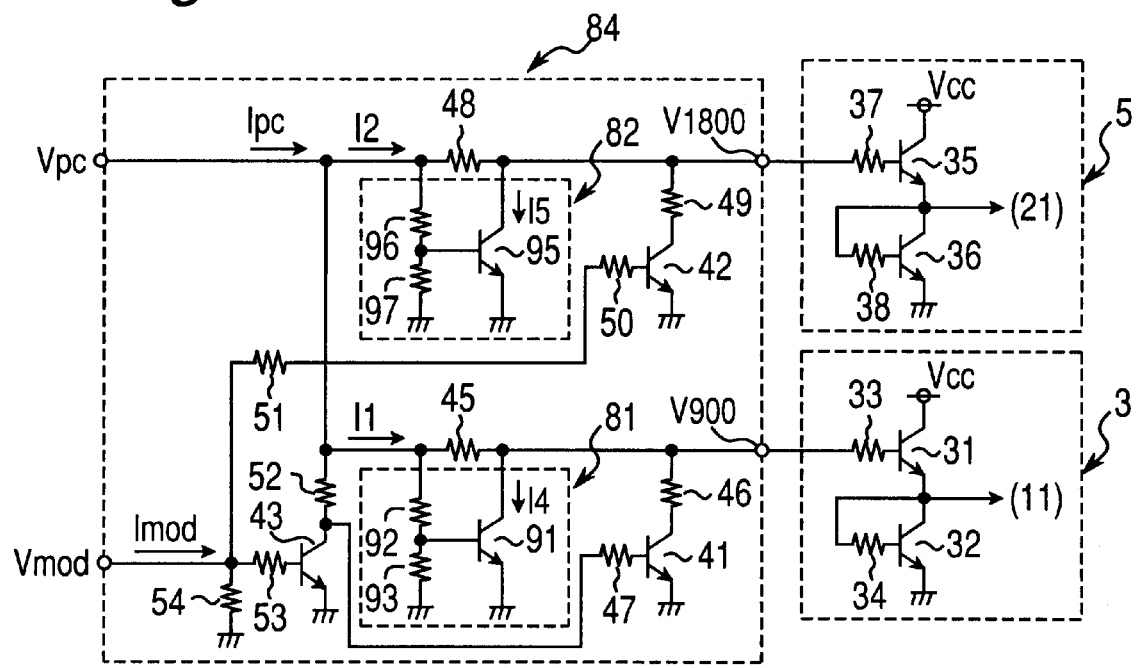
FIG. 8 is a typical circuit diagram of a high frequency power amplifier according to a second embodiment of the present invention.

FIG. 8 is a typical circuit diagram showing the first biasing circuit, second biasing circuit, and bias switching circuit in a dual band system high frequency power amplifier according to this second preferred embodiment of the present invention. It is to be noted that a typical circuit diagram of a high frequency power amplifier according to this second embodiment of the invention is the same as that shown in FIG. 1 except for changing the reference numeral for the bias switching circuit, and further description is therefore omitted below.

In addition, like parts in FIG. 8 and FIG. 2 are indicated by the same reference numerals. Further description of such like parts is omitted below where only the differences between FIG. 8 and FIG. 2 are described.

The bias switching circuit 84 shown in FIG. 8 differs from the bias switching circuit 6 in FIG. 2 in the addition of protection circuits 81 and 82.

As shown in FIG. 8, this bias switching circuit 84 comprises HBT 41 to 43, resistors 45 to 54, and protection circuits 81 and 82.

Protection circuit 81 comprises HBT 91 and resistors 92 and 93, and forms a Vbe multiplier. Resistors 92 and 93 are connected in series between terminal Vpc and ground. The collector of HBT 91 is connected to a node between resistor 45 and resistor 46, that is, to terminal V900; the base is connected to a node between resistor 92 and resistor 93; and the emitter is to ground.

Protection circuit 82 likewise comprises HBT 95 and resistors 96 and 97, and forms a Vbe multiplier. Resistors 96 and 97 are connected in series between terminal Vpc and ground. The collector of HBT 95 is connected to a node between resistor 48 and resistor 49, that is, to terminal V1800; the base is connected to a node between 96 and resistor 97; and the emitter is to ground.

In a bias switching circuit 84 thus comprised, the on voltage of HBT 91 in protection circuit 81 is multiplied $\{(R92+R93)/R93\}$ where the resistance of resistor 92 is R92 and the resistance of resistor 93 is R93. For example, if the on voltage of HBT 91 is approximately 1.3 V, and resistances R92 and R93 are set so that $\{(R92+R93)/R93\}=2.3$, HBT 91 will turn on when voltage Vpc goes to 3 V, and collector current I4 will flow to HBT 91. A voltage drop thus occurs at resistor 45, controlling the voltage at terminal V900 to 3 V or less so that when an overvoltage is applied to terminal Vpc, the overvoltage is prevented from being directly applied to first biasing circuit 3, and is thus prevented from being applied to the first power amplifier 2.

The on voltage of HBT 95 in protection circuit 82 is likewise multiplied $\{(R96+R97)/R97\}$ where the resistance of resistor 96 is R96 and the resistance of resistor 97 is R97. For example, if the on voltage of HBT 95 is approximately 1.3 V, and resistances R96 and R97 are set so that $\{(R96+R97)/R97\}=2.3$, HBT 95 will turn on when voltage Vpc goes to 3 V, and collector current I5 will flow to HBT 95. A voltage drop thus occurs at resistor 48, controlling the voltage at terminal V1800 to 3 V or less so that when an overvoltage is applied to terminal Vpc, the overvoltage is prevented from being directly applied to second biasing circuit 5, and is thus prevented from being applied to the second power amplifier 4.

Figure 9:
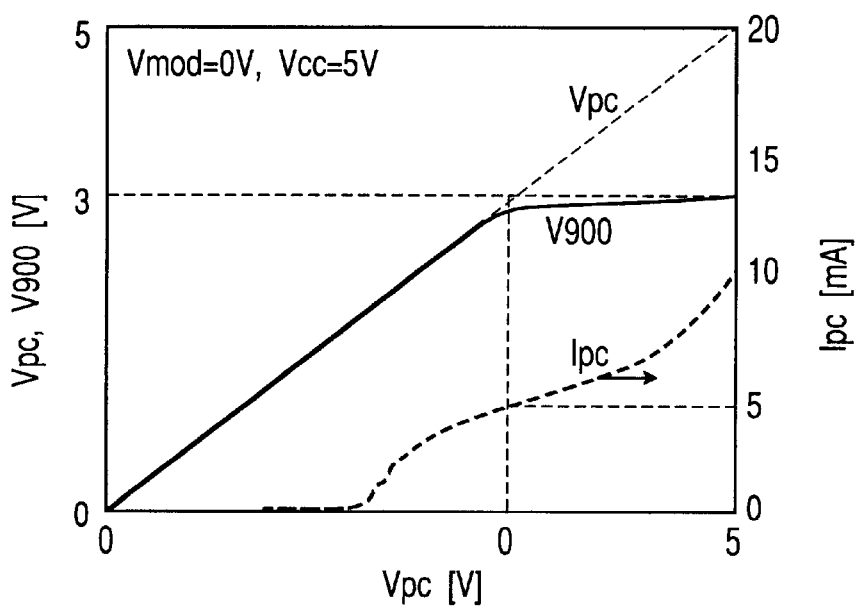
FIG. 9 is a graph of a typical operating characteristic of the bias switching circuit in the power amplifier shown in FIG. 8.
Figure 10:
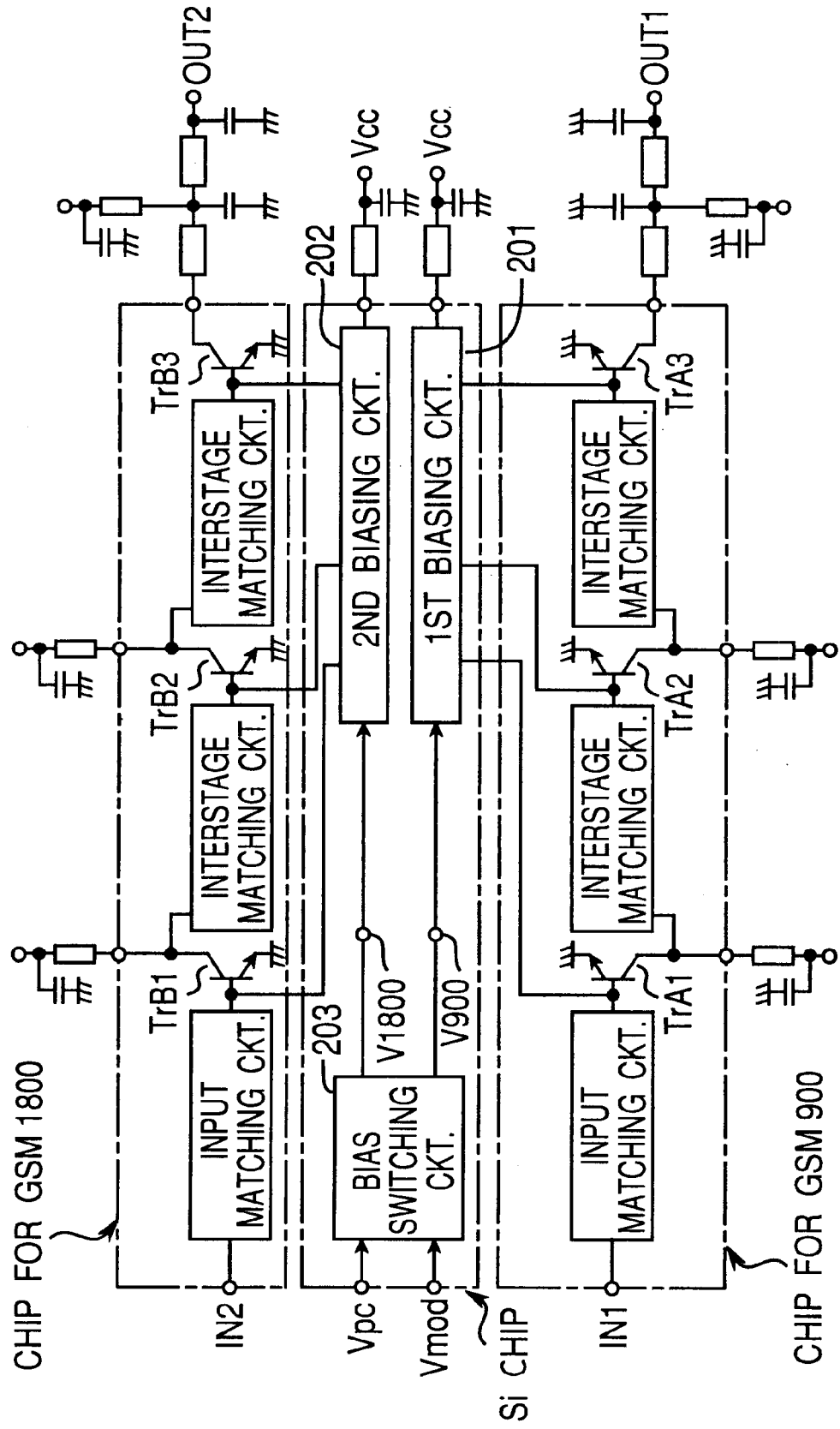
FIG. 10 is a typical circuit block diagram of a dual band system high frequency power amplifier according to the related art.
Figure 11:
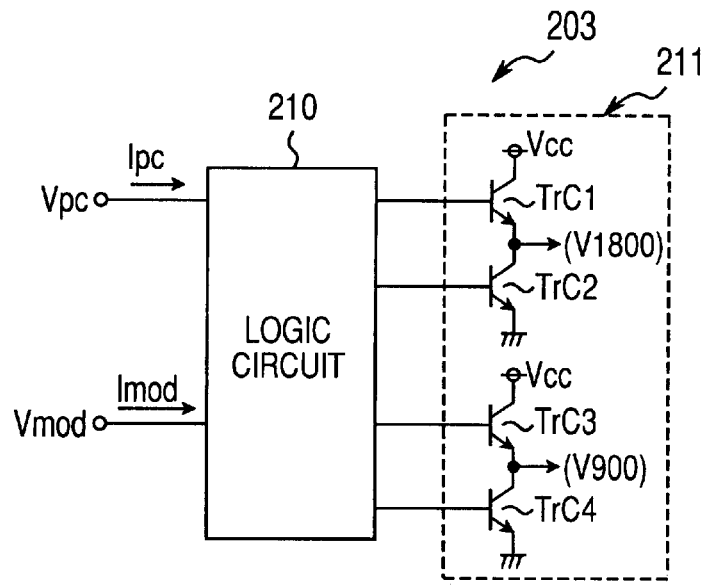
FIG. 11 is a typical circuit diagram of the bias switching circuit shown in FIG. 10.
Figure 12A:
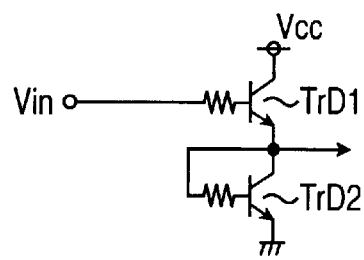
FIG. 12A and FIG. 12B are typical circuit diagrams of the biasing circuits shown in FIG. 10 comprising HBTs.
Figure 12B:
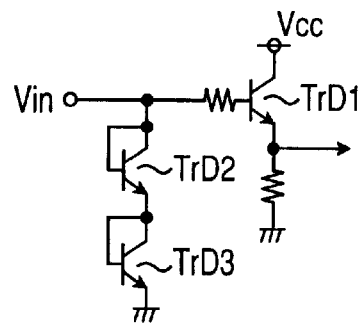

FIG. 9 is a graph of the operating characteristics of the bias switching circuit 84 shown in FIG. 8. As will be known from FIG. 9, the voltage at terminal V900 increases proportionally to voltage Vpc when voltage Vpc<3 V, and is controlled to 3 V or less when voltage Vpc≧3 V.

It is to be noted that this preferred embodiment as shown in FIG. 8 adds protection circuits 81 and 82 to the bias switching circuit 6 shown in FIG. 2, but the present invention shall not be so limited. More specifically, protection circuits 81 and 82 can be alternatively added to any of the bias switching circuits shown in FIG. 5, FIG. 6, and FIG. 7. The bias switching circuit will be the same as shown in FIG. 8 when the protection circuits 81 and 82 are added to the bias switching circuit in FIG. 5. However, when added to bias switching circuit 6B in FIG. 6, the collector of HBT 91 in protection circuit 81 is connected to a node between resistors 45B and 71c, and the collector of HBT 95 in protection circuit 82 is connected to a node between resistors 48B and 72c. When these protection circuits are added to the bias switching circuit 6C in FIG. 7, the collector of HBT 91 in protection circuit 81 is connected to a node between resistors 74 and 75c, and the collector of HBT 95 in protection circuit 82 is connected to a node between resistors 77 and 78c.

As described above, a high frequency power amplifier according to this second preferred embodiment of the present invention has protection circuits 81 and 82 forming Vbe multipliers in the bias switching circuit 84 so that when an overvoltage is applied to terminal Vpc, the overvoltage is not passed and applied to terminal V900 or V1800.

Therefore, when a high frequency power amplifier according to this preferred embodiment is used in a system such as a GSM mobile phone in which the power source of the power amplifier is connected directly to a battery power source, it is possible to protect the first power amplifier 2 and second power amplifier 4 from thermal runaway when, for example, terminal Vpc accidentally directly contacts the battery for some reason. Heat damage to the high frequency power amplifier or a mobile phone in which this high frequency power amplifier is used can thus also be prevented, and these protective and safety benefits can be achieved in addition to the benefits obtained by a high frequency power amplifier according to the first embodiment of the invention.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A high frequency power amplifier for a dual band system, comprising:

first and second power amplifiers, each power amplifier comprising at least one power amplifying heterojunction bipolar transistor (HBT);

first and second biasing circuits providing a bias for the first and second power amplifiers, respectively, each biasing circuit comprising an HBT; and a bias switching circuit for exclusive switching between the first and second biasing circuits in accordance with first and second signals input to the bias switching circuit, the bias switching circuit comprising:

a first switching circuit comprising a first HBT for controlling output of the first signal to the second biasing circuit;

a second switching circuit comprising a second HBT for controlling output of the first signal to the first biasing circuit; and a third switching circuit comprising a third HBT for controlling operation of the second switching circuit according to the second signal for controlling operation of the first switching circuit, for exclusive selection and operation of the first and second switching circuits wherein the first power amplifier and the first biasing circuit are integrated circuits integrated in a first semiconductor substrate, the second power amplifier and the second biasing circuit are integrated circuits integrated in a second semiconductor substrate, and the biasing circuit is an integrated circuit integrated with other circuits on one of the first and second semiconductor substrates.

2. The high frequency power amplifier according to claim 1, wherein each of the first and second switching circuits comprises a series resistance circuit having a plurality of resistors connected in series for voltage dividing a signal voltage, and;

the first and second HBTs are ground-connecting HBTs for controlling connection of the series resistance circuit to ground, and for outputting a control signal to the second and first biasing circuits, respectively, from a node between resistors in the series resistance circuit.

3. The high frequency power amplifier according to claim 2, wherein:

each of the first and second power amplifiers is a multi-stage power amplifier including a plurality of power amplifying HBTs, each of the first and second biasing circuits has a circuit for supplying a bias to each of the power amplifying HBTs of a corresponding one of the first and second power amplifiers, and the first and second switching circuits output control signals to the second and first biasing circuits, respectively, so that a bias current gradually increases from a bias supplied to a first stage power amplifying HBT to a bias supplied to a last stage power amplifying HBT.

4. The high frequency power amplifier according to claim 2, wherein each of the first and second switching circuits comprises a signal level adjusting resistor for adjusting the control signal applied to the corresponding one of the first and second biasing circuits, the signal level adjusting resistor being connected to a node between resistors in the series resistance circuit and to a node between the series resistance circuit and the ground-connecting HBTs.

5. The high frequency power amplifier according to claim 2, wherein the first, second, and third HBTs have respective bases and the third HBT of the third switching circuit controls a bias supplied to the base of the second HBT of the second switching circuit according to the second signal.

6. The high frequency power amplifier according to claim 1, wherein each of the first and second switching circuits comprise protection circuits for protecting the first and second biasing circuits, respectively, from an overvoltage applied to a terminal for receiving the first signal.

7. The high frequency power amplifier according to claim 6, wherein each protection circuit is a Vbe multiplier comprising an HBT.

8. The high frequency power amplifier according to claim 1, wherein each of the first, second, and third HBTs includes a respective base and collector, the second signal is supplied to respective bases of the first and third HBTs of the first and third switching circuits, and the signal produced at the collector of the third HBT of the third switching circuit is supplied to the base of the second HBT of the second switching circuit.

9. A high frequency power amplifier for a dual band system, comprising:

first and second power amplifiers, each power amplifier comprising at least one power amplifying heterojunction bipolar transistor (HBT);

first and second biasing circuits providing a bias for the first and second power amplifiers, respectively, each biasing circuit comprising an HBT; and a bias switching circuit for exclusive switching between the first and second biasing circuits in accordance with first and second signals input to the bias switching circuit, the bias switching circuit comprising:

a first switching circuit comprising a first HBT for controlling output of the first signal which controls operation of the second biasing circuit;

a second switching circuit comprising a second HBT for controlling output of the first signal to the first biasing circuit, wherein each of the first and second switching circuits comprises a series resistance circuit having a plurality of resistors connected in series for voltage dividing a signal voltage, and the first and second HBTs are ground-connecting HBTs for controlling connection of the series resistance circuit to ground, and for outputting a control signal to the second and first biasing circuits, respectively, from a node between resistors in the series resistance circuit; and a third switching circuit comprising a third HBT for controlling operation of the second switching circuit according to the second signal for controlling operation of the first switching circuit, for exclusive selection and operation of the first and second switching circuits.

10. The high frequency power amplifier according to claim 9, wherein:

each of the first and second power amplifiers is a multi-stage power amplifier including a plurality of power amplifying HBTs, each of the first and second biasing circuits has a circuit for supplying a bias to each of the power amplifying HBTs of a corresponding one of the first and second power amplifiers, and the first and second switching circuits output control signals to the second and first biasing circuits, respectively, so that a bias current gradually increases from a bias supplied to a first stage power amplifying HBT to a bias supplied to a last stage power amplifying HBT.

11. The high frequency power amplifier according to claim 9, wherein each of the first and second switching circuits comprises a signal level adjusting resistor for adjusting the control signal applied to the corresponding one of the first and second biasing circuits, the signal level adjusting resistor being connected to a node between resistors in the series resistance circuit and to a node between the series resistance circuit and the ground-connecting HBTs.

12. The high frequency power amplifier according to claim 9, wherein the first, second, and third HBTs have respective bases and the third HBT of the third switching circuit controls a bias supplied to the base of the second HBT of the second switching circuit according to the second signal.

13. The high frequency power amplifier according to claim 9, wherein the first and second switching circuits comprise protection circuits for protecting the first and second biasing circuits, respectively, from an overvoltage applied to a terminal for receiving the first signal.

14. The frequency power amplifier according to claim 13, wherein each protection circuit is a Vbe multiplier comprising an HBT.

15. The high frequency power amplifier according to claim 9, wherein each of the first, second, and third HBTs includes a respective base and collector, the second signal is supplied to respective bases of the first and third HBTs of the first and third switching circuits, and the signal produced at the collector of the third HBT of the third switching circuit is supplied to the base of the second HBT of the second switching circuit.

16. A high frequency power amplifier for a dual band system, comprising:

first and second power amplifiers, each power amplifier comprising at least one power amplifying heterojunction bipolar transistor (HBT);

first and second biasing circuits providing a bias for the first and second power amplifiers, respectively, each biasing circuit comprising an HBT; and a bias switching circuit for exclusive switching between the biasing circuits in accordance with first and second signals input to the bias switching circuit, the bias switching circuit comprising:

a first switching circuit comprising an HBT for controlling output of the first signal to the first biasing circuit;

a second switching circuit comprising an HBT for controlling output of the first signal to the second biasing circuit; and a third switching circuit comprising an HBT for controlling operation of the second switching circuit according to the second signal for controlling operation of the first switching circuit for exclusive selection and operation of the first and second switching circuits, wherein each of the first and second switching circuits comprises a protection circuit for protecting a corresponding one of the first and second biasing circuits from an overvoltage applied to a terminal for receiving the first signal.

17. The frequency power amplifier according to claim 16, wherein each protection circuit is a Vbe multiplier comprising an HBT.

18. A high frequency power amplifier for a dual band system, comprising:

first and second power amplifiers, each power amplifier comprising at least one power amplifying heterojunction bipolar transistor (HBT);

first and second biasing circuits providing a bias for the first and second power amplifiers, respectively, each biasing circuit comprising an HBT; and a bias switching circuit for exclusive switching between the biasing circuits in accordance with first and second signals input to the bias switching circuit, the bias switching circuit comprising:

a first switching circuit comprising an HBT for controlling output of the first signal to the first biasing circuit;

a second switching circuit comprising an HBT for controlling output of the first signal to the second biasing circuit; and a third switching circuit comprising an HBT for controlling operation of the second switching circuit according to the second signal for controlling operation of the first switching circuit for exclusive selection and operation of the first and second switching circuits, wherein each of the HBTs includes a respective base and collector, the second signal is supplied to respective bases of the HBTs of the first and third switching circuits, and the signal produced at the collector of the HBT of the third switching circuit is supplied to the base of the HBT of the first switching circuit.

* * * * *

UNITED STATES PATENT AND TRADEMARK OFFICE
CERTIFICATE OF CORRECTION

| | | |
|---|---|---|
| PATENT NO. | : 6,297,694 B1 | Page 1 of 1 |
| APPLICATION NO. | : 09/448519 | |
| DATED | : October 2, 2001 | |
| INVENTOR(S) | : Kazuya Yamamoto | |

It is certified that error appears in the above-identified patent and that said Letters Patent is hereby corrected as shown below:

Column 13, line 46, change "biasing" to --bias switching--.

Signed and Sealed this
Sixteenth Day of August, 2011

David J. Kappos
*Director of the United States Patent and Trademark Office*